United States Patent [19]
Drechsel

[11] Patent Number: 4,738,832
[45] Date of Patent: Apr. 19, 1988

[54] CRYSTAL HOLDER

[75] Inventor: Dieter Drechsel, Bruchköel, Fed. Rep. of Germany

[73] Assignee: Leybold-Heraeus GmbH, Cologne, Fed. Rep. of Germany

[21] Appl. No.: 719,362

[22] Filed: Apr. 3, 1985

[30] Foreign Application Priority Data

Apr. 14, 1984 [DE] Fed. Rep. of Germany ....... 3414290

[51] Int. Cl.$^4$ .............................................. B01D 9/00
[52] U.S. Cl. .................................... 422/249; 269/49; 156/617 SP; 156/DIG. 98; 156/617.1
[58] Field of Search ............... 422/249; 156/DIG. 98; 269/46

[56] References Cited

U.S. PATENT DOCUMENTS

| | | | |
|---|---|---|---|
| 3,511,609 | 5/1970 | Kato | 156/DIG. 98 |
| 3,511,610 | 5/1970 | Dohmen | 422/249 |
| 4,367,199 | 1/1983 | Jericho | 422/249 |
| 4,371,502 | 2/1983 | Sibley et al. | 422/249 |
| 4,600,564 | 7/1986 | Lissalde et al. | 422/249 |
| 4,613,486 | 9/1986 | Tatsumi et al. | 156/DIG. 98 |
| 4,663,128 | 5/1987 | Hegeland | 422/249 |

*Primary Examiner*—Gary P. Straub
*Attorney, Agent, or Firm*—Felfe & Lynch

[57] ABSTRACT

A crystal holder for apparatus for pulling a crystal from a melt in a crucible with a reelable pulling member fastened to the crystal holder has thermal insulation between the fastener for the reelable pulling member and a clamping device for the crystal. The thermal insulation preferably comprises a tie rod between sections of the crystal holder, the tie rod having a cross section sufficiently smaller than the sections for insulation therebetween, an insulating spacer about the tie rod, and radiation shields about the spacer, the radiation shields having diameters no longer than the sections of the crystal holder. Foil insulation spaced about the crystal holder at the crystal clamp may also be provided. The insulation appreciably extends the life of the pulling member.

8 Claims, 2 Drawing Sheets

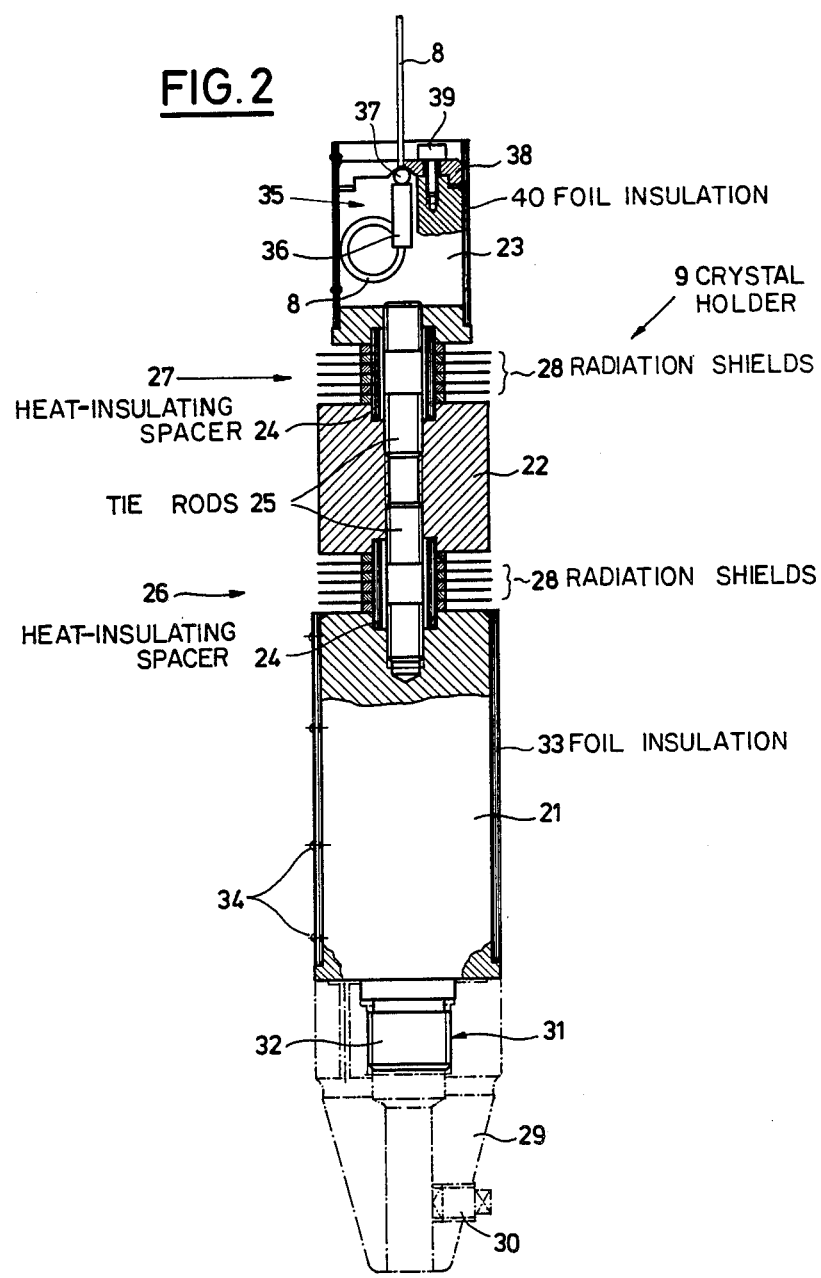

CRYSTAL HOLDER

BACKGROUND OF THE INVENTION

The invention relates to apparatus for growing and pulling a crystal from a melt in a crucible with a reelable pulling member having a crystal holder fastened on one end and, more particularly, the crystal holder.

The crystal-pulling methods carried out with such apparatus are often called Czochralski methods. The melt is usually a semiconductor material such as silicon.

An apparatus of the type referred to above is known from published German patent application DOS No. 31 16 916. It discloses a crystal holder of one-piece construction and relatively-short overall length fastened to a reelable pulling member which, preferably, is a steel rope.

At the start of the crystal-growing process with such apparatus, the weight on the pulling rope consists only of the weight of the crystal holder and the small, so-called seed crystal from which the crystal is grown. On completion of the crystal-growing process, however, the crystal and crystal holder will have a weight of from about 60 to 80 or more kg which must be supported by the rope pulling the crystal from the melt.

It was thought, therefore, that a sufficient strength for the rope corresponded to a breaking load of about 210 kg for a new rope. After some 15 to 20 uses, this drops drastically to a breaking load of about 100 kg which still seemed sufficient.

It has now been found, however, that the most critical part of the rope is the portion directly above the crystal holder at the start of a crystal-growing process. The crystal holder and the adjacent lower end of the rope to which it is fastened are then within the range of radiation from the melt and crucible and, possibly, even of the heater for the crucible. There, temperatures of over 1200° C. can prevail. Temperature measurements made on a crystal holder in that critical position have shown that, in the case of a silicon melt having a temperature of 1450° C., the temperature at the point of attachment of the rope is about 900° C. This high temperature accounts for the fact that the breaking load of the rope is reduced by more than 50 percent in the cold state after repeated use, and it is to be expected that the breaking load is still lower in the hot state.

Thus, there is the danger that the rope will break at the crystal-holder end during the crystal-growing process due to thermal fatigue, with the crystal-holder then dropping into the melt. The resulting interruption of the crystal-growing process would be bad enough, but it can also displace enough of the melt onto the crucible heater to damage it, too. For example, the heater is often made of graphite which will then react violently with silicon to form silicon carbide. The latter has greater volume than the silicon, and the structural parts involved, for example the crucible, will therefore be shattered by stresses. The damage can easily range to thousands of dollars. There is also a safety hazard.

It has been sought to remedy the situation by making the crystal holder longer, thereby increasing the distance of the lower end of the rope from the maximum-temperature region. However, these efforts have never been more than moderately successful and entail the substantial drawback that, because of the increased length of the crystal holder, a corresponding portion of the so-called crystal-pulling path was lost, and only correspondingly shorter crystals could be grown. Increasing the overall height of the entire apparatus, which invariably is several times the length of the crystal, to compensate for the longer crystal holder often is out of the question because of the overall height of the available manufacturing bay. It has therefore been necessary up to now to replace the crystal-pulling rope after every 10 to 15 crystal-growing processes or so. While the resulting outage of the apparatus entails annoying production losses, these are put up with for reasons of greater-loss prevention and safety.

SUMMARY OF THE INVENTION

The object of the invention, therefore, is to provide an apparatus of the initially-described type which has a crystal holder that will not result in the loss of too large a portion of the crystal-pulling path, yet permits the maximum rope temperature to be kept at a lower level than heretofore possible.

In accordance with the invention, this object is accomplished in the initially-described apparatus with a crystal holder having at least one region of reduced thermal conductivity thereacross between the fastening for a pulling member and a clamp for holding the crystal.

By this measure, heat conduction to the end of the crystal-pulling rope fastened to the crystal holder is appreciably reduced. Measurements made on an embodiment of the invention in which the crystal holder was only 10 cm longer than another crystal holder not embodying the invention have shown that a temperature reduction of just over 180° C. had been achieved. Analysis of the tensile strength of the crystal-pulling rope after 13 crystal-growing processes showed only an insignificant reduction of the breaking load from the original, new-rope value.

With respect to the effects of the invention, it should be noted that the lower portion of the crystal holder is inevitably exposed to considerable thermal stresses and, if the crystal holder is made of thermally-conductive metal throughout, has the tendency to give off at least a major portion of the heat to the fastened-on end of the rope or its fastening. Transmission of heat in the longitudinal direction is considerably reduced by the invention and this appears significant as described above.

It has proved particularly advantageous for the crystal holder to be made in the longitudinal direction of at least two heavy sections which are joined together by heat-insulating spacers and tie rods. The tie rods have cross-sectional areas considerably smaller than that of the other, heavy sections and, thus, can transmit only a minor portion of the heat from one, lowermost, crystal-holding section to the uppermost section to which the crystal-pulling rope is fastened. The spacers between the sections can also be arranged to provide dissipation.

In accordance with another characteristic of the invention, a further heat barrier is obtained by providing the spacers with radiation shields. Advantageously, the outside diameter of the radiation shields is at least not appreciably larger than that of the adjacent sections. In other words, the radial dimension of the radiation shields is within the surface of projection of the crystal holder onto a horizontal plane. Absorption of heat by the radiation shields themselves through radiation from below thus is largely prevented.

Finally, it will be particularly advantageous for at least the lower section to be surrounded by foil insulation.

BRIEF DESCRIPTION OF THE DRAWINGS

A merely-illustrative, preferred embodiment of the invention will now be described in greater detail with reference to the accompanying drawing, wherein:

FIG. 2 shows the crystal holder of FIG. 1 on an enlarged scale.

DETAILED DESCRIPTION OF THE INVENTION

Figure 1:
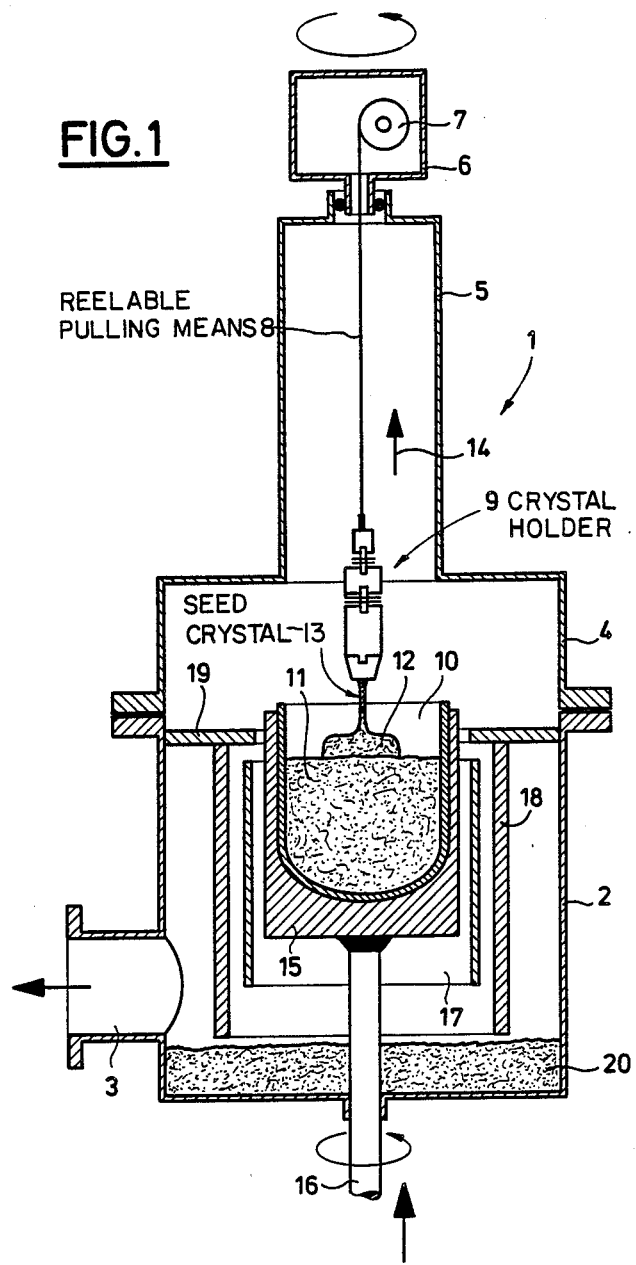
FIG. 1 is a vertical section through a diagrammatic representation of a complete crystal-growing apparatus.

Shown in FIG. 1 is a crystal-growing apparatus 1 which comprises a vacuum chamber 2 with a vacuum pipe 3 for connecting a set of vacuum pumps, which are not shown. The vacuum chamber 2 includes an upper chamber part 4 with a tubular superstructure 5 which at the end of the crystal-growing process encloses the crystal. A rotatable platform 6 holding a reel 7 for a reelable pulling means 8 is mounted on the top of the superstructure 5. Rotation of the platform 6 with the reel 7 imposes on the pulling means 8 a rotation that is transmitted to a crystal holder 9. Details of this crystal holder will be given in connection with FIG. 2.

Located within the vacuum chamber 2 is a melting crucible 10 containing a melt 11 of a semiconductor material. From this melt a crystal is grown through controlled freezing, starting from a seed crystal 13 clamped to the lower end of the crystal holder 9 and immersed in the melt at the outset. By gradually raising it in the direction of the arrow 14, a crystal 12 of well-defined diamter and a length of up to 2 meters, depending on the overall height of the apparatus, and a weight of about 80 kg and up can be grown in this manner.

The crucible 10 is mounted in a crucible holder 15, which in turn is attached to the upper end of a lifting rod 16. Through appropriate upward movement of the lifting rod 16, the position of the melt level can be kept constant. Crucible and crucible holder are surrounded by a heating means 17 which is constructed of graphite as a hollow cylinder provided with a meandering slot. For the sake of simplicity, the electric power connections are not shown. The entire arrangement, including the heating means 17, is surrounded by heat insulation 18, usually graphite felt. The space around the crucible 10 is bounded at the top by a circular partition 19. The bottom of the vacuum chamber 2 is likewise covered with heat insulation 20. It is apparent from FIG. 1 that the crystal holder 9 is highly stressed thermally by the unavoidable radiation of heat from the melt level and the inner surface of the crucible 10.

As shown in FIG. 2, the crystal holder 9 is assembled in the longitudinal direction from a total of three heavy sections 21, 22 and 23, which are spaced apart by heat-insulating spacers 24, made of a material of low thermal conductivity, and joined together by tie rods 25. Since the cross-sectional area of the tie rods 25 is considerably smaller than that of the sections 21 to 23, two regions 26 and 27 of reduced thermal conductivity are formed in the longitudinal direction of the crystal holder 9.

The spacers 24 are provided with radiation shields 28 consisting of circular sheet-metal disks and spaced from one another and from the sections 21 to 23 by metal rings which will not be described in detail. The outer periphery of the radiation shields is within the surface of projection of the sections 21 to 23 onto a horizontal plane, in other words, the radiation shields do not project outwardly beyond the contours of the sections. The importance of this feature has been brought out above.

As shown in FIG. 2, the lower section is provided with a clamping device 29 for the seed crystal 13 (FIG. 1), which can be secured in place by means of a lock screw 30. The clamping device 29 is provided with an internal thread 31, and through the latter and a complementary threaded pin 32 it is removably secured to the lower section 21.

Said lower section is surrounded by foil insulation 33 consisting of a sheet-metal winding whose individual turns are spaced apart by means of spacers 34 secured in place by pins.

The upper section 23 comprises a fastening device 35 for the pulling means 8, which at its lower end is provided with a sleeve 36 secured to it and with a ball 37 which through a diametral bore has been slipped onto the pulling means. The fastening device 35 includes a mounting plate 38 which is secured by means of screws 39 and which at the point where the ball 37 is located is provided with a complementary cuplike depression. The crystal holder 9 thus is able to rotate about the center of the ball 37 without imposing bending stresses on the pulling means 8. As a result, the crystal holder is always oriented vertically under its own weight. In the present case, the upper section 23 is also surrounded by foil insulation 40, whose makeup is the same as that of the foil insulation 33.

It will be appreciated that the instant specification and claims are set forth by way of illustration and not of limitation, and that various changes and modifications may be made without departing from the spirit and scope of the present invention.

What is claimed is:

1. Apparatus for pulling a crystal from a melt in a crucible, comprising:
   an elongate, flexible and reelable pulling member;
   a crystal holder having a substantially vertical axis including
   a fastening device for fastening one end of said crystal holder to said pulling member;
   a clamping device for holding a crystal at the opposite end of said crystal holder; and
   at least one thermal barrier means arranged between the fastening device and the clamping device having a lower thermal conductivity than the rest of said crystal holder, said thermal barrier means comprising a connecting section of substantially reduced cross section, joining together portions of said crystal holder that incorporate the fastening device and the clamping device, respectively, so as to provide an interruption to conductive heat flow from the crystal and the melt to said pulling member, and at least one radiation shield extending outward perpendicular to said axis of said crystal holder to an outer periphery which is at least substantially as wide as the outer periphery of said crystal holder;
   whereby said crystal holder protects said pulling member from the heat of the crystal and the melt.

2. The crystal holder of claim 1 wherein the thermal barrier means comprises at least one heat-insulating spacer between two neighboring portions of the crystal holder.

3. The crystal holder according to claim 2, wherein said connecting section is surrounded by at least one spacer, and further comprising at least one radiation shield surrounding said at least one spacer.

4. The crystal holder according to claim 3, wherein no substantial portion of said at least one radiation shield projects beyond the sections of the crystal holder separated by the spacer which the radiation shield surrounds.

5. The crystal holder according to claim 1, and further comprising foil insulation spaced about at least a portion of the crystal holder.

6. The crystal holder according to claim 2, and further comprising foil insulation spaced about at least a portion of the crystal holder.

7. The crystal holder according to claim 3, and further comprising foil insulation spaced about at least a portion of the crystal holder.

8. The crystal holder according to claim 4, and further comprising foil insulation spaced about at least a portion of the crystal holder.

* * * * *